(12) United States Patent
Wang et al.

(10) Patent No.: US 10,910,595 B2
(45) Date of Patent: Feb. 2, 2021

(54) FLEXIBLE DISPLAY PANEL AND FLEXIBLE DISPLAY APPARATUS

(71) Applicant: BOE Technology Group Co., Ltd., Beijing (CN)

(72) Inventors: Dawei Wang, Beijing (CN); Chunyan Xie, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 3 days.

(21) Appl. No.: 16/099,525

(22) PCT Filed: Oct. 20, 2017

(86) PCT No.: PCT/CN2017/107001
§ 371 (c)(1),
(2) Date: Nov. 7, 2018

(87) PCT Pub. No.: WO2019/075714
PCT Pub. Date: Apr. 25, 2019

(65) Prior Publication Data
US 2019/0148670 A1    May 16, 2019

(51) Int. Cl.
*H01L 21/31* (2006.01)
*H01L 21/469* (2006.01)
(Continued)

(52) U.S. Cl.
CPC .... *H01L 51/5253* (2013.01); *G02F 1/133305* (2013.01); *G02F 1/133345* (2013.01);
(Continued)

(58) Field of Classification Search
CPC . H01L 51/0097; H01L 52/56; H01L 23/3135; H01L 23/3192; H01L 23/295;
(Continued)

(56) References Cited

U.S. PATENT DOCUMENTS

2016/0240817 A1* 8/2016 Cho .................... H01L 51/5256
2017/0062741 A1    3/2017 Shin
2017/0222176 A1* 8/2017 Hayk ...................... H01L 51/56

FOREIGN PATENT DOCUMENTS

| CN | 104638200 A | 5/2015 |
| CN | 105810716 A | 7/2016 |
| CN | 105895823 A | 8/2016 |

OTHER PUBLICATIONS

International Search Report & Written Opinion dated Jul. 20, 2018, regarding PCT/CN2017/107001.
(Continued)

*Primary Examiner* — Duy T Nguyen
*Assistant Examiner* — Dilinh P Nguyen
(74) *Attorney, Agent, or Firm* — Intellectual Valley Law, P.C.

(57) ABSTRACT

The present application discloses a display panel. The display panel includes a base substrate; a display unit on the base substrate; and an encapsulating layer on a side of the display unit distal to the base substrate and encapsulating the display unit. The encapsulating layer includes a first inorganic encapsulating layer on a side of the display unit distal to the base substrate; and a first organic encapsulating layer and a second organic encapsulating layer on a side of the first inorganic encapsulating layer distal to the display unit. Each of the first organic encapsulating layer and the second organic encapsulating layer is in contact with the first inorganic encapsulating layer. The first organic encapsulating layer has a Young's modulus lower than that of the second organic encapsulating layer.

19 Claims, 7 Drawing Sheets

(51) Int. Cl.
  *H01L 51/52*   (2006.01)
  *H01L 51/00*   (2006.01)
  *G02F 1/1333*  (2006.01)

(52) U.S. Cl.
  CPC ...... *H01L 51/0097* (2013.01); *H01L 51/5256*
        (2013.01); *H01L 2251/5338* (2013.01)

(58) Field of Classification Search
  CPC . H01L 31/0488; H01L 23/29; H01L 23/3164;
        H01L 31/0481; H01L 33/56; G02F
        1/133305; G02F 1/133345
  USPC .................................................. 257/789–790
  See application file for complete search history.

(56) References Cited

OTHER PUBLICATIONS

First Office Action in the Indian Patent Application No. 201837046326, dated Nov. 17, 2020.

\* cited by examiner

←——Length direction of the bendable portion B——→

FLEXIBLE DISPLAY PANEL AND FLEXIBLE DISPLAY APPARATUS

CROSS-REFERENCE TO RELATED APPLICATION

This application is a national stage application under 35 U.S.C. § 371 of International Application No. PCT/CN2017/107001, filed Oct. 20, 2017, the contents of which are incorporated by reference in the entirety.

TECHNICAL FIELD

The present invention relates to display technology, more particularly, to a flexible display panel and a flexible display apparatus.

BACKGROUND

A flexible display apparatus is a bendable or deformable display apparatus having a flexible display panel Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present invention provides a display panel comprising a base substrate; a display unit on the base substrate; and an encapsulating layer on a side of the display unit distal to the base substrate and encapsulating the display unit; wherein the encapsulating layer comprises a first inorganic encapsulating layer on a side of the display unit distal to the base substrate; and a first organic encapsulating layer and a second organic encapsulating layer on a side of the first inorganic encapsulating layer distal to the display unit; wherein each of the first organic encapsulating layer and the second organic encapsulating layer is in contact with the first inorganic encapsulating layer; and the first organic encapsulating layer has a Young's modulus lower than that of the second organic encapsulating layer.

Optionally, the display panel has a bendable portion; and an orthographic projection of the first organic encapsulating layer on a plane containing a surface of the base substrate at least partially overlaps with an orthographic projection of the bendable portion on the plane containing the surface of the base substrate.

Optionally, the orthographic projection of the first organic encapsulating layer on the plane containing the surface of the base substrate substantially covers the orthographic projection of the bendable portion on the plane containing the surface of the base substrate.

Optionally, a width of the first organic encapsulating layer is approximately 1.2 times to approximately 2.0 times a width of the bendable portion.

Optionally, a width of the second organic encapsulating layer is no more than approximately one third of a width of the first organic encapsulating layer.

Optionally, the first organic encapsuldating layer is on a side of the second organic encapsulating layer distal to the first inorganic encapsulating layer, and substantially covers the second organic encapsulating layer.

Optionally, a thickness of second organic encapsulating layer is no more than approximately one half of a thickness of the first organic encapsulating layer.

Optionally, the display panel has a bendable portion; and an orthographic projection of the second organic encapsulating layer on a plane containing a surface of the base substrate at least partially overlaps with an orthographic projection of the bendable portion on the plane containing the surface of the base substrate.

Optionally, the orthographic projection of the bendable portion on the plane containing the surface of the base substrate substantially covers the orthographic projection of the second organic encapsulating layer on the plane containing a surface of the base substrate.

Optionally, the display panel has a bendable portion; and the second organic encapsulating layer comprises a single second organic encapsulating block extending along a direction substantially parallel to a length direction of the bendable portion, and extending substantially through an entire length of the encapsulating layer.

Optionally, the display panel has a bendable portion; and the second organic encapsulating layer comprises a plurality of second organic encapsulating blocks spaced apart from each other and along a direction substantially parallel to a length direction of the bendable portion.

Optionally, the encapsulating layer further comprises a third organic encapsulating layer on a side of the first inorganic encapsulating layer distal to the display unit, and in contact with the first inorganic encapsulating layer.

Optionally, the first organic encapsulating layer is on a side of the second organic encapsulating layer distal to the first inorganic encapsulating layer, and substantially covers the second organic encapsulating layer, the first organic encapsulating layer has a first side, a second side and a third side connecting the first side and the second side, a first portion of the third side in contact with the first inorganic encapsulating layer, a second portion of the third side in contact with the second organic encapsulating layer; and the third organic encapsulating layer sandwiches the first organic encapsulating layer on the first side and the second side.

Optionally, the third organic encapsulating layer comprises a third organic material; the second organic encapsulating layer comprises a second organic material; and the third organic material and the second organic material have a substantially the same Young's modulus.

Optionally, the third organic encapsulating layer and the second organic encapsulating layer are made of a same material.

Optionally, the third organic encapsulating layer comprises a third organic material; the second organic encapsulating layer comprises a second organic material; and the third organic material has a Young's modulus different from that of the second organic material.

Optionally, each of the third organic encapsulating layer and the second organic encapsulating layer comprises one or a combination of a polyacrylate and an epoxy resin.

Optionally, the first organic encapsulating layer comprises a silicone resin.

Optionally, the display panel is an organic light emitting diode display panel; and the display unit comprises a plurality of organic light emitting diodes and a plurality of thin film transistors.

Optionally, the display panel has a bendable portion; the first organic encapsulating layer comprises a plurality of rows of first organic encapsulating blocks, each of which extending substantially along a length direction of the bendable portion; the second organic encapsulating layer comprises a plurality of rows of second organic encapsulating blocks, each of which extending along a direction substantially parallel to a length direction of the bendable portion; and each row of the plurality of rows of second organic encapsulating blocks comprises a single second organic encapsulating block extending substantially through an entire length of the encapsulating layer.

Optionally, the display panel has a bendable portion; the first organic encapsulating layer comprises a plurality of rows of first organic encapsulating blocks, each of which extending along a direction substantially parallel to a length direction of the bendable portion; the second organic encapsulating layer comprises a plurality of rows of second organic encapsulating blocks, each of which extending along a direction substantially parallel to a length direction of the bendable portion; and each row of the plurality of rows of second organic encapsulating blocks comprises a plurality of second organic encapsulating blocks spaced apart from each other.

Optionally, the display panel further comprises a second inorganic encapsulating layer on a side of the first organic encapsulating layer and the second organic encapsulating layer distal to the first inorganic encapsulating layer; the first organic encapsulating layer is in contact with the second inorganic encapsulating layer, and the second organic encapsulating layer is spaced apart from the second inorganic encapsulating layer by the first organic encapsulating layer.

Optionally, the encapsulating layer further comprises a third organic encapsulating layer between the first inorganic encapsulating layer and the second inorganic encapsulating layer, and in contact with the first inorganic encapsulating layer and the second inorganic encapsulating layer.

In another aspect, the present invention provides a display apparatus comprising the display panel described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
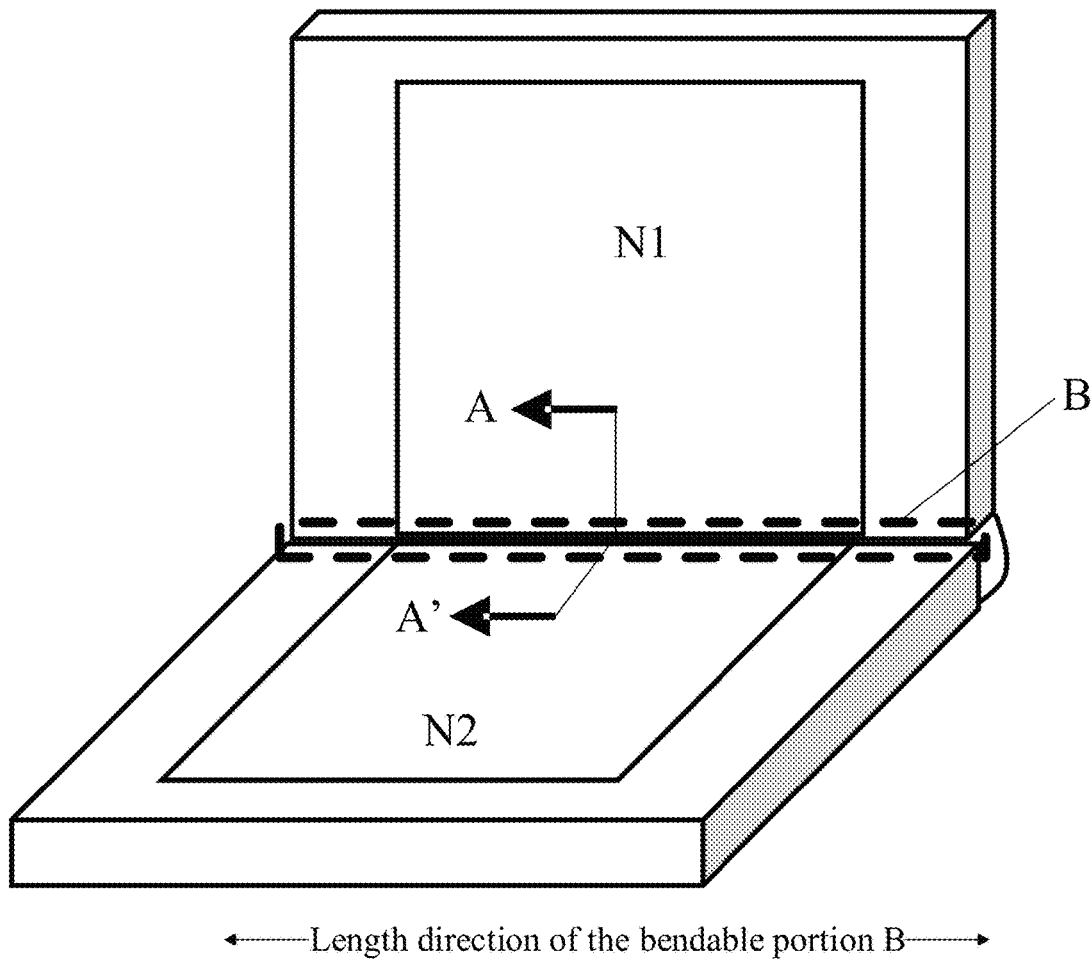
FIG. 1 is a diagram illustrating the structure of a flexible display panel in some embodiments according to the present disclosure.

FIG. 1 is a diagram illustrating the structure of a flexible display panel in some embodiments according to the present disclosure. Referring to FIG. 1, the flexible display panel includes at least a bendable portion B. In one example, the flexible display panel is a rollable display panel which contains many bendable portions B. In another example, the flexible display panel is a foldable display panel. For example, the foldable display panel may include a bendable portion B, a first non-bendable portion N1 and a second non-bendable portion N2 on two opposite sides of the bendable portion B. In a folded configuration, the first non-bendable portion N1 and the second non-bendable portion N2 face each other. In the unfolded configuration, the bendable portion B, the first non-bendable portion N1, and the second non-bendable portion N2, may be substantially co-planar. Optionally, the bendable portion B, the first non-bendable portion N1, and the second non-bendable portion N2, constitute an integral foldable or rollable display panel.

Figure 2:
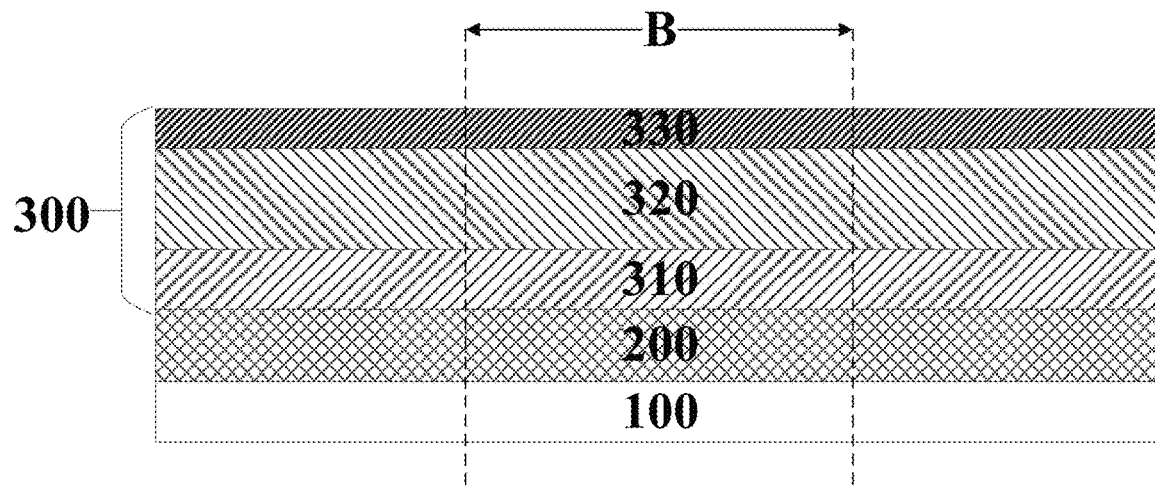
FIG. 2 is a cross-sectional view along A-A' line of FIG. 1 in some embodiments according to the present disclosure.

FIG. 2 is a cross-sectional view along A-A' line of FIG. 1 in some embodiments according to the present disclosure. Referring to FIG. 2, the flexible display panel in some embodiments includes a flexible base substrate 100; a display unit 200 on the flexible base substrate 100; an encapsulating layer 300 on a side of the display unit 200 distal to the flexible base substrate 100 and encapsulating the display unit 200. The encapsulating layer 300 in some embodiments includes a first inorganic encapsulating layer 310 on a side of the display unit 200 distal to the flexible base substrate 100, an organic encapsulating layer 320 on a side of the first inorganic encapsulating layer 310 distal to the display unit 200, and a second inorganic encapsulating layer 330 on a side of the organic encapsulating layer 320 distal to the first inorganic encapsulating layer 310. In order to achieve a good flexibility, the organic encapsulating layer 320 is typically made of material having a relatively high elasticity, e.g., a material having a relatively small Young's modulus. The material having a relatively small Young's modulus, however, typically has a relatively poorer adhesiveness to the inorganic encapsulating layers (e.g., the first inorganic encapsulating layer 310 and the second inorganic encapsulating layer 330). Often this results in the organic encapsulating layer 320 being separated from (e.g., peeled off) the inorganic encapsulating layers, particularly at or around the bendable portion B of the flexible display panel, leading to defects in the flexible display panel.

Accordingly, the present disclosure provides, inter alia, a flexible display panel and a flexible display apparatus that substantially obviate one or more of the problems due to limitations and disadvantages of the related art. In one aspect, the present disclosure provides a display panel having a bendable portion in a position at which the display panel can be bent. In some embodiments, the display panel includes a base substrate; a display unit on the base substrate; and an encapsulating layer on a side of the display unit distal to the base substrate and encapsulating the display unit. Optionally, the encapsulating layer includes a first inorganic encapsulating layer on a side of the display unit distal to the base substrate; and a first organic encapsulating layer and a second organic encapsulating layer on a side of the first inorganic encapsulating layer distal to the display unit. Optionally, each of the first organic encapsulating layer and the second organic encapsulating layer is in contact with the first inorganic encapsulating layer. Optionally, the first organic encapsulating layer has a Young's modulus lower than that of the second organic encapsulating layer. Optionally, the display unit is a liquid crystal display unit having a plurality of thin film transistors for respectively driving light emission in a plurality of subpixels. The liquid crystal display unit in each subpixel includes a common electrode, a pixel electrode and a liquid crystal molecule layer sandwich between two opposing substrates. Optionally, the display unit is an organic light emitting display unit having a plurality of organic light emitting diodes respectively in a plurality of subpixels, and a plurality of thin film transistors for respectively driving light emission in the plurality of organic light emitting diodes. Each of the plurality of organic light emitting diodes in one of the plurality of subpixels includes a cathode, an anode, and an organic light emitting layer between the cathode and the anode.

Figure 3:
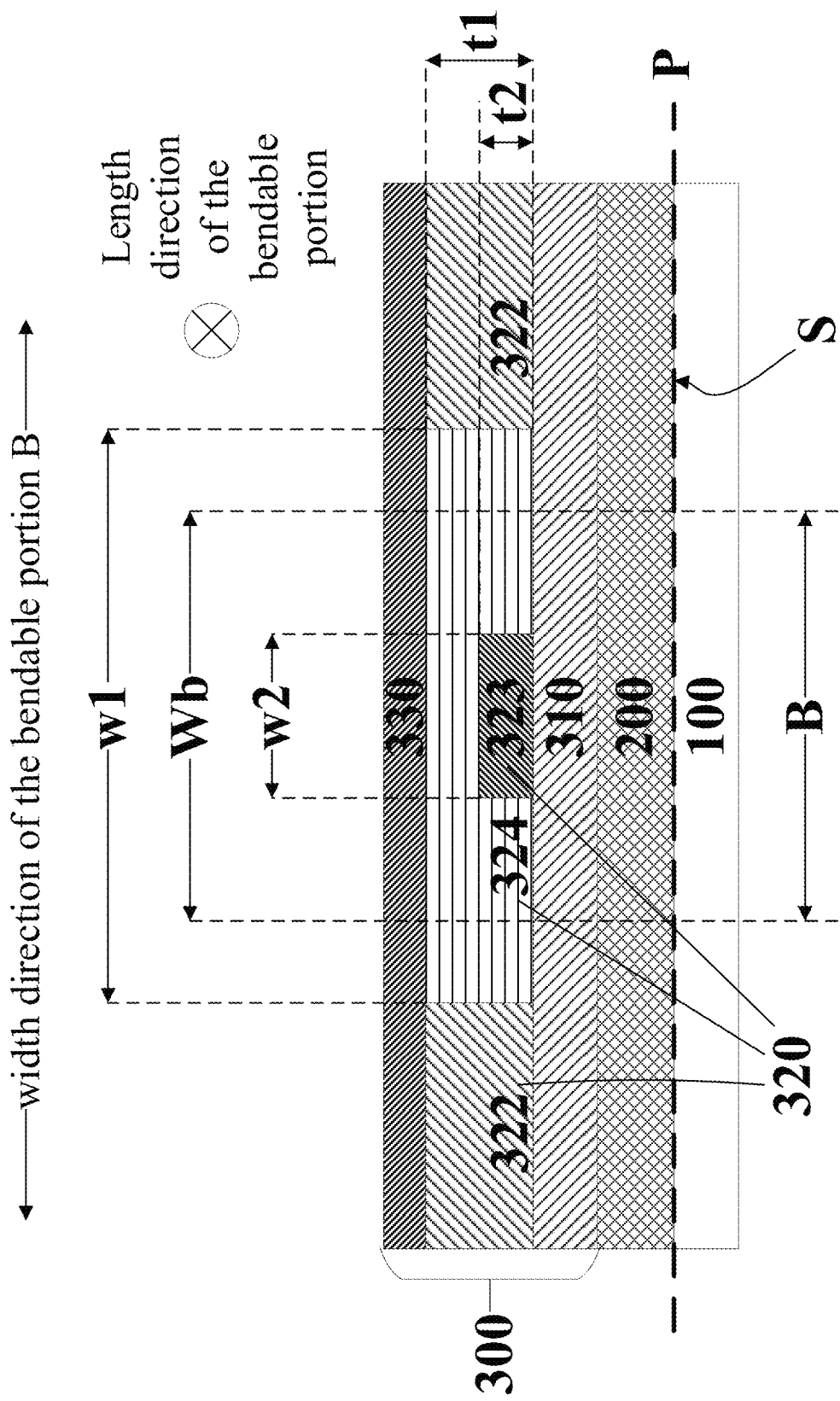
FIG. 3 is a cross-sectional view along A-A' line of FIG. 1 in some embodiments according to the present disclosure.

FIG. 3 is a cross-sectional view along A-A' line of FIG. 1 in some embodiments according to the present disclosure. Referring to FIG. 3, the flexible display panel in some embodiments includes a flexible base substrate 100, a display unit 200 on the flexible base substrate 100; an encapsulating layer 300 on a side of the display unit 200 distal to the flexible base substrate 100 and encapsulating the display unit 200. In some embodiments, the encapsulating layer 300 includes a first inorganic encapsulating layer 310 on a side of the display unit 200 distal to the flexible base substrate 100; and an organic encapsulating layer 320 on a side of the first inorganic encapsulating layer 310 distal to the display unit 200. As shown in FIG. 3, the organic encapsulating layer 320 in some embodiments includes a first organic encapsulating layer 324, a second organic encapsulating layer 323, and a third organic encapsulating layer 322 on a side of the first inorganic encapsulating layer 310 distal to the display unit 200. In one example, the first organic encapsulating layer 324, the second organic encapsulating layer 323, and the third organic encapsulating layer 322 are substantially on a same horizontal plane, e.g., the plane containing the upper surface of the first inorganic encapsulating layer 310. Optionally, each of the first organic encapsulating layer 324, the second organic encapsulating layer 323, and the third organic encapsulating layer 322 is in contact with the first inorganic encapsulating layer 310. Optionally, the first organic encapsulating layer 324 is on a side of the second organic encapsulating layer 323 distal to the first inorganic encapsulating layer 310, and substantially covers the second organic encapsulating layer 323. Optionally, the first organic encapsulating layer 324 has a first side, a second side and a third side connecting the first side and the second side. A first portion (e.g., a peripheral portion) of the third side is in contact with the first inorganic encapsulating layer 310. A second portion (e.g., a central portion) of the third side is in contact with the second organic encapsulating layer 323. Optionally, the third organic encapsulating layer 322 sandwiches the first organic encapsulating layer 324 on the first side and the second side.

Optionally, the second organic encapsulating layer 323 has a first side, a second side, and a third side connecting the first side and the second side. Optionally, the third side of the second organic encapsulating layer 323 is in contact with the first inorganic encapsulating layer 310. The first organic encapsulating layer 324 sandwiches the second organic encapsulating layer 323 on the first side and the second side.

In some embodiments, the first organic encapsulating layer 324 is more flexible than the second organic encapsulating layer 323 and the third organic encapsulating layer 322. Optionally, the first organic encapsulating layer 324 is more elastic than the second organic encapsulating layer 323 and the third organic encapsulating layer 322. Optionally, the second organic encapsulating layer 323 and the third organic encapsulating layer 322 have a greater adhesiveness to the first inorganic encapsulating layer 310 as compared to the first encapsulating layer 324. Optionally, the first organic encapsulating layer 324 has a Young's modulus lower than those of the second organic encapsulating layer 323 and the third organic encapsulating layer 322. Optionally, a ratio of a Young's modulus of the first organic encapsulating layer 324 to a Young's modulus of the second organic encapsulating layer 323 or the third organic encapsulating layer 322 is in a range of approximately 1:40 to approximately 1:20,000, e.g., approximately 1:40 to approximately 1:400, approximately 1:400 to approximately 1:2,000, approximately 1:2,000 to approximately 1:4,000, approximately 1:4,000 to approximately 1:8,000, approximately 1:8,000 to approximately 1:12,000, approximately 1:12,000 to approximately 1:14,000, approximately 1:14,000 to approximately 1:16,000, approximately 1:16,000 to approximately 1:18,000, and approximately 1:18,000 to approximately 1:20,000.

In some embodiments, the third organic encapsulating layer 322 includes a third organic material the second organic encapsulating layer 323 includes a second organic material, and the first organic encapsulating layer 324 includes a first organic material. Optionally, the first organic material (e.g., a polymer material) has a Young's modules in a range of approximately 0.001 GPa to approximately 0.5 Gpa, e.g., approximately 0.001 GPa to approximately 0.05 Gpa, approximately 0.05 GPa to approximately 0.1 Gpa approximately 0.1 GPa to approximately 0.2 Gpa, approximately 0.2 GPa to approximately 0.3 Gpa, approximately 0.3 GPa to approximately 0.4 Gpa, and approximately 0.4 GPa to approximately 0.5 Gpa. Optionally, the first organic material (e.g., a polymer material) has a Young's modules in a range of approximately 0.5 GPa to approximately 1.5 Gpa, e.g., approximately 0.5 GPa to approximately 1.0 Gpa and approximately 1.0 GPa to approximately 1.5 Gpa. Optionally, the first organic material (e.g., a polymer material) has a Young's modules in a range of approximately 2.0 to approximately 20 GPa, e.g., approximately 2.0 to approximately 4.0 GPa, approximately 4.0 to approximately 6.0 GPa, approximately 6.0 to approximately 8.0 GPa, approximately 8.0 to approximately 10 GPa, approximately 10 to approximately 12.5 GPa, approximately 12.5 to approximately 15 GPa, approximately 15 to approximately 17.5 GPa, and approximately 17.5 to approximately 20 GPa. Optionally, the second organic material (e.g., a polymer material) has a Young's modules in a range of approximately 2.0 to approximately 20 GPa, e.g., approximately 2.0 to approximately 4.0 GPa, approximately 4.0 to approximately 6.0 GPa, approximately 6.0 to approximately 8.0 GPa, approximately 8.0 to approximately 10 GPa, approximately 10 to approximately 12.5 GPa, approximately 12.5 to approximately 15 GPa, approximately 15 to approximately 17.5 GPa, and approximately 17.5 to approximately 20 GPa. Optionally, the third organic material (e.g., a polymer material) has a Young's modules in a range of approximately 2.0 to approximately 20 GPa, e.g., approximately 2.0 to approximately 4.0 GPa, approximately 4.0 to approximately 6.0 GPa, approximately 6.0 to approximately 8.0 GPa, approximately 8.0 to approximately 10 GPa, approximately 10 to approximately 12.5 GPa, approximately 12.5 to approximately 15 GPa, approximately 15 to approximately 17.5 GPa, and approximately 17.5 to approximately 20 GPa.

1 Optionally, the third organic material has a Young's modulus different from that of the second organic material. Optionally, the third organic material and the second organic material have a substantially the same Young's modulus. Optionally, the third organic encapsulating layer 322 and the second organic encapsulating layer 323 are made of a same material. In one example, the third organic encapsulating layer 322 and the second organic encapsulating layer 323 are formed in a same layer using a same mask plate in a single patterning process.

1 In some embodiments, each of the first organic encapsulating layer 324, the second organic encapsulating layer 323, and the third organic encapsulating layer 322 is made of one or a combination of a silicone resin, a polyacrylate, an epoxy resin, and a polyurethane acrylate resin, as long as the first organic encapsulating layer 324 has a Young's modulus lower than those of the third organic encapsulating layer 322 and the second organic encapsulating layer 323. Optionally, the first organic encapsulating layer 324 includes a silicone resin. Optionally, the third organic encapsulating layer 322 includes one or a combination of a polyacrylate and an epoxy resin. Optionally, the second organic encapsulating layer 323 includes one or a combination of a polyacrylate and an epoxy resin.

In some embodiments, an orthographic projection of the first organic encapsulating layer 324 on a plane containing a surface (e.g., an upper surface) of the flexible base substrate 100 at least partially overlaps with an orthographic projection of the bendable portion B on the plane containing the surface of the flexible base substrate 100. As shown in FIG. 3, in some embodiments, the orthographic projection of the first organic encapsulating layer 324 on the plane P containing the surface S of the flexible base substrate 100 substantially covers the orthographic projection of the bendable portion B on the plane P containing the surface S of the flexible base substrate 100.

Optionally, an orthographic projection of the third organic encapsulating layer 322 on a plane containing a surface (e.g., an upper surface) of the flexible base substrate 100 is substantially outside (e.g., non-overlapping with) orthographic projections of the first organic encapsulating layer 324 and the second organic encapsulating layer 323 on the plane containing the surface of the flexible base substrate 100.

Referring to FIG. 3, the first organic encapsulating layer 324 has a width w1 along a width direction of the bendable portion B. The bendable portion B has a width Wb along the width direction of the bendable portion B. Optionally, the second organic encapsulating layer 323 has a width w2 along the width direction of the bendable portion B. In some embodiments, the width w1 is greater than the width Wb, which in turn is greater than the width w2. Optionally, the width w1 is approximately 1.2 times to approximately 2.0 times (e.g., approximately 1.2 times to approximately 1.4 times, approximately 1.4 times to approximately 1.6 times, approximately 1.6 times to approximately 1.8 times, and approximately 1.8 times to approximately 2.0 times) the width Wb. Optionally, the width w2 is no more than approximately one third (e.g., no more than one sixth) of the width w1. Optionally, a ratio of the width w2 to the width w1 is in a range of approximately 1:6 to approximately 1:3.

In some embodiments, the first organic encapsulating layer 324 is on a side of the second organic encapsulating layer 323 distal to the first inorganic encapsulating layer 310, and substantially covers the second organic encapsulating layer 323. Optionally, the second organic encapsulating layer 323 is in contact with the first inorganic encapsulating layer 310, and the first organic encapsulating layer 324 is in contact with the second organic encapsulating layer 323, and in contact with the first inorganic encapsulating layer 310 on two sides of the second organic encapsulating layer 323.

Referring to FIG. 3, in some embodiments, the first organic encapsulating layer 324 has a thickness (e.g., a maximum thickness) t1, and the second organic encapsulating layer 323 has a thickness (e.g., a maximum thickness) t2. Optionally, the thickness t1 is greater than the thickness t2, i.e., the first organic encapsulating layer 324 covers the second organic encapsulating layer 323. Optionally, the thickness t2 is no more than approximately one half (e.g., no more than one quarter) of the thickness t1. Optionally, a ratio of the thickness t2 to the thickness t1 is in a range of approximately 1:4 to approximately 1:2.

In some embodiments, an orthographic projection of the second organic encapsulating layer 323 on a plane containing a surface of the flexible base substrate 100 at least partially overlaps with an orthographic projection of the bendable portion B on the plane containing the surface of the flexible base substrate 100. Referring to FIG. 3, the orthographic projection of the second organic encapsulating layer 323 on the plane P containing a surface S of the flexible base substrate 100 100 at least partially overlaps with the orthographic projection of the bendable portion B on the plane P containing the surface S of the flexible base substrate 100. Optionally, the orthographic projection of the bendable portion B on the plane P containing the surface S of the flexible base substrate 100 substantially covers the orthographic projection of the second organic encapsulating layer 323 on the plane P containing a surface S of the flexible base substrate 100.

Figure 4:
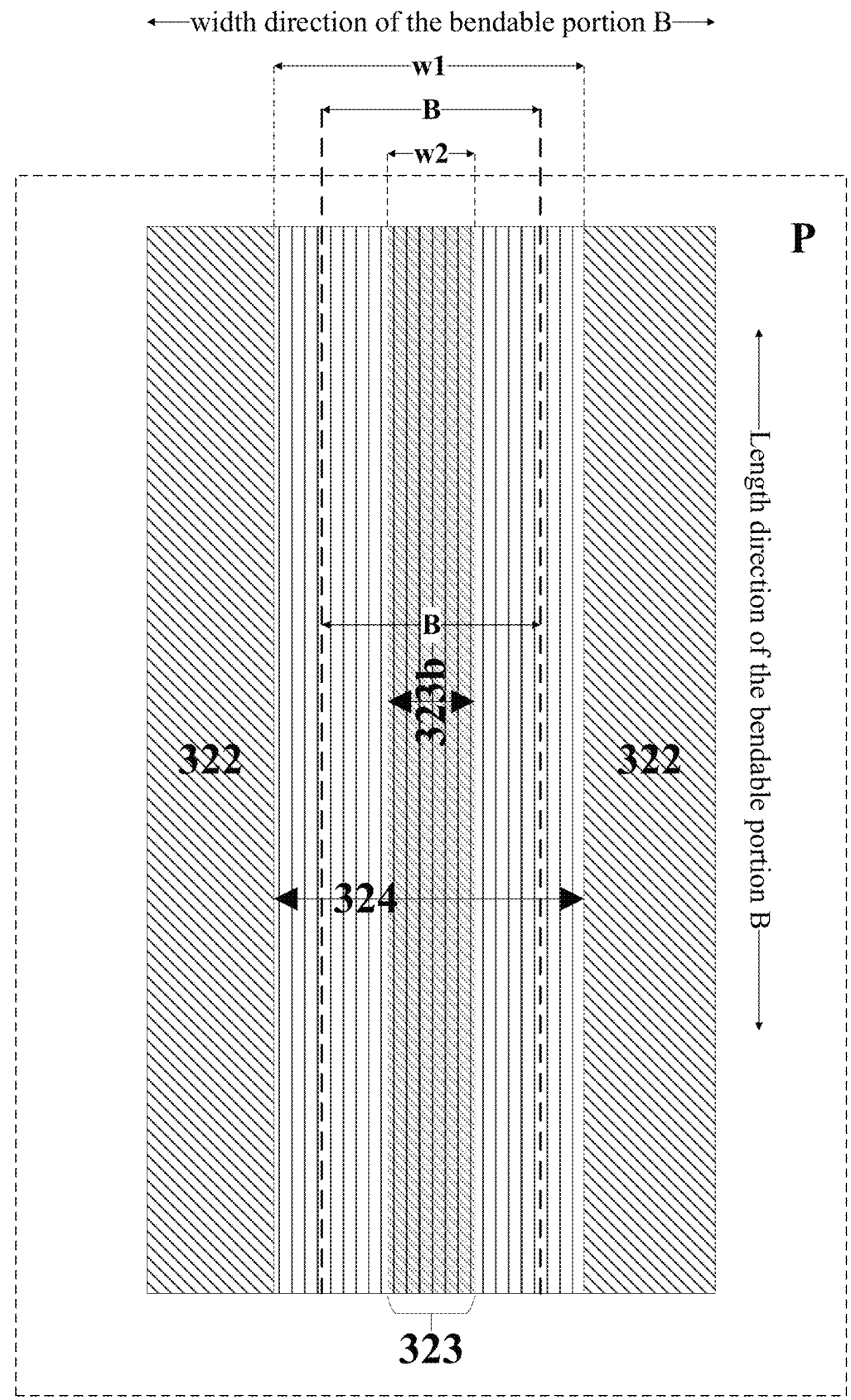
FIG. 4 is a plan view of the flexible display panel in some embodiments according to the present disclosure.

FIG. 4 is a plan view of the flexible display panel in some embodiments according to the present disclosure. Referring to FIG. 4 and FIG. 3, in some embodiments, the second organic encapsulating layer 323 includes a single second organic encapsulating block 323b extending along a direction substantially parallel to a length direction of the bendable portion B, and extending substantially through an entire length of the encapsulating layer 300 (e.g., an entire length of the third organic encapsulating layer 322 or an entire length of the first inorganic encapsulating layer 310). Referring to FIG. 3 and FIG. 4, the orthographic projection of the first organic encapsulating layer 324 on the plane P containing the surface S of the flexible base substrate 100 at least partially overlaps with the orthographic projection of the bendable portion B on the plane P containing the surface S of the flexible base substrate 100. Optionally, the orthographic projection of the first organic encapsulating layer 324 on the plane P containing the surface S of the flexible base substrate 100 substantially covers the orthographic projection of the bendable portion B on the plane P containing the surface S of the flexible base substrate 100. Referring to FIG. 3 and FIG. 4, the orthographic projection of the second organic encapsulating layer 323 on the plane P containing a surface S of the flexible base substrate 100 100 at least partially overlaps with the orthographic projection of the bendable portion B on the plane P containing the surface S of the flexible base substrate 100. Optionally, the orthographic projection of the bendable portion B on the plane P containing the surface S of the flexible base substrate 100 substantially covers the orthographic projection of the second organic encapsulating layer 323 on the plane P containing a surface S of the flexible base substrate 100.

Figure 5:
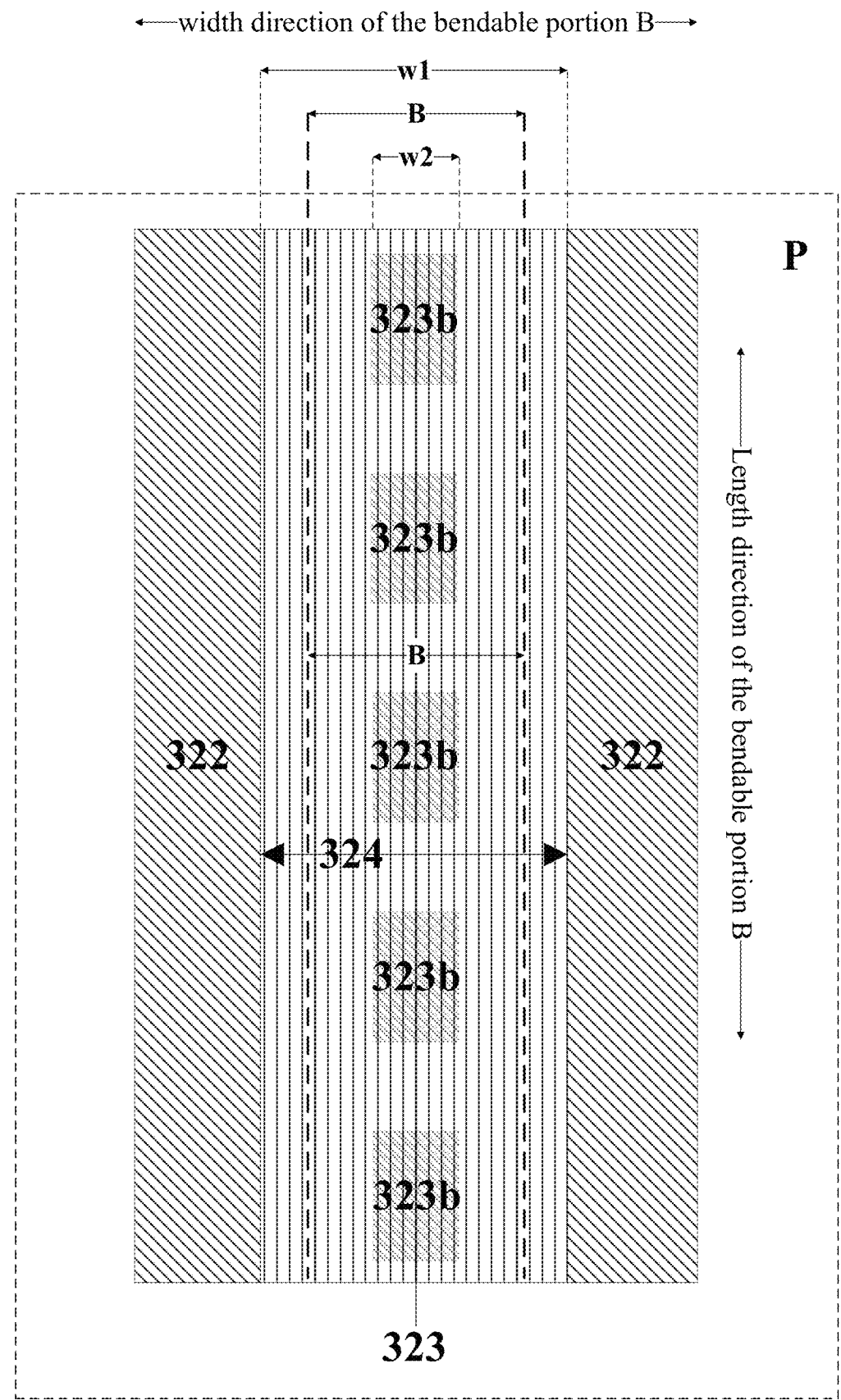
FIG. 5 is a plan view of the flexible display panel in some embodiments according to the present disclosure.

FIG. 5 is a plan view of the flexible display panel in some embodiments according to the present disclosure. Referring to FIG. 5 and FIG. 3, in some embodiments, the second organic encapsulating layer 323 includes a plurality of second organic encapsulating blocks 323b spaced apart from each other and arranged along a direction substantially parallel to a length direction of the bendable portion B.

Figure 6:
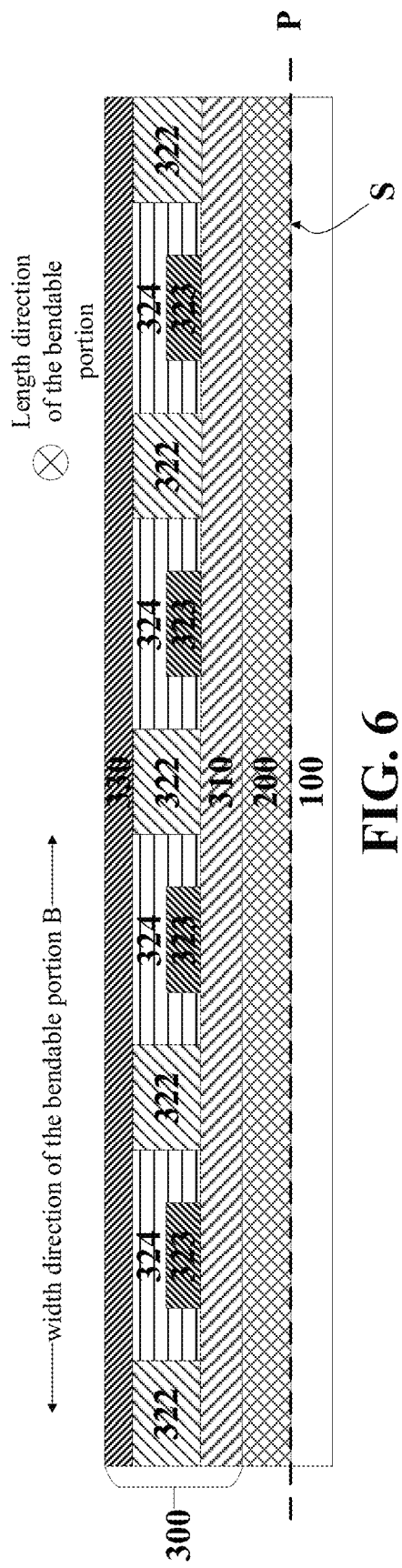
FIG. 6 is a cross-sectional view along A-A' line of FIG. 1 in some embodiments according to the present disclosure.
Figure 7:
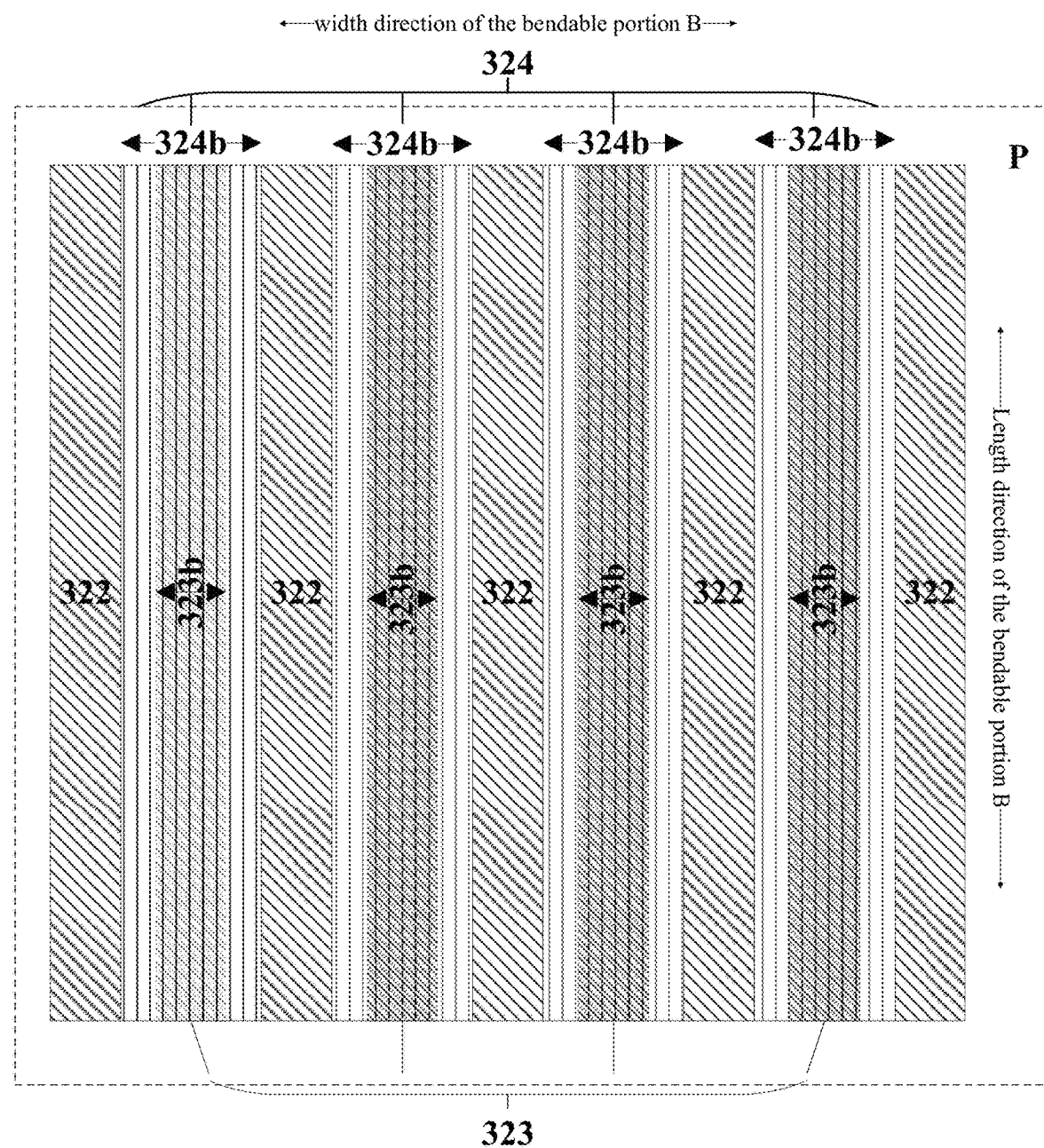
FIG. 7 is a plan view of the flexible display panel in some embodiments according to the present disclosure.
Figure 8:
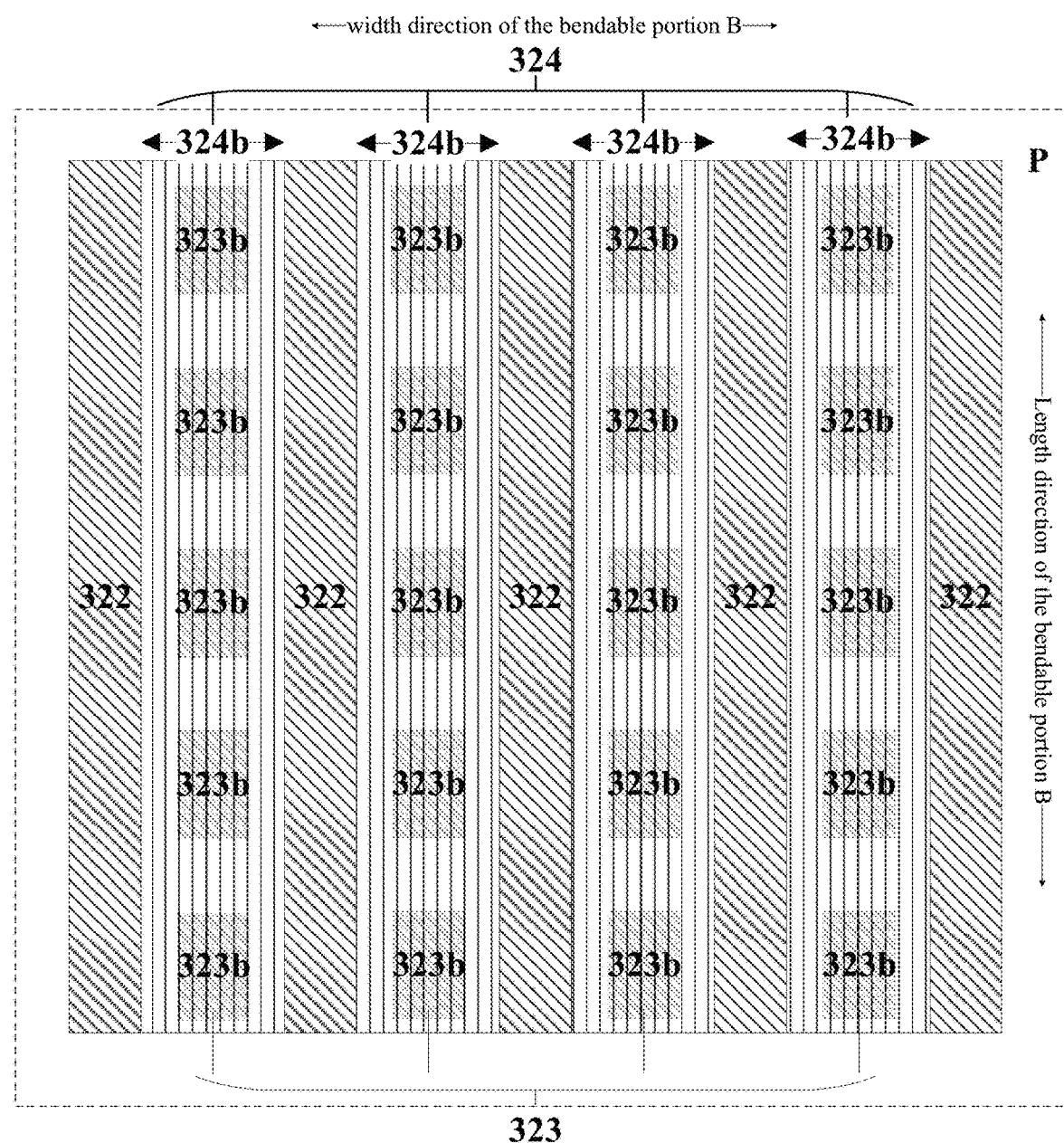
FIG. 8 is a plan view of the flexible display panel in some embodiments according to the present disclosure.

FIG. 6 is a cross-sectional view along A-A' line of FIG. 1 in some embodiments according to the present disclosure. FIG. 7 is a plan view of the flexible display panel in some embodiments according to the present disclosure. FIG. 8 is a plan view of the flexible display panel in some embodiments according to the present disclosure. Referring to FIGS. 6 to 8, in some embodiments, the first organic encapsulating layer 324 includes a plurality of rows of first organic encapsulating blocks 324b. Each row of the plurality of rows of first organic encapsulating blocks 324b extends substantially along a length direction of the bendable portion B. Two adjacent rows of the plurality of rows of first organic encapsulating blocks 324b are spaced apart by the third organic encapsulating layer 322. The second organic encapsulating layer 323 includes a plurality of rows of second organic encapsulating blocks 323b. Each row of the plurality of rows of second organic encapsulating blocks 323b extends along a direction substantially parallel to a length direction of the bendable portion B. Referring to FIG. 7, in some embodiments, each row of the plurality of rows of second organic encapsulating blocks 323b includes a single organic encapsulating block extending substantially through an entire length of the encapsulating layer 300 (e.g., an entire length of the third organic encapsulating layer 322 or an entire length of the first inorganic encapsulating layer 310). Referring to FIG. 8, in some embodiments, each row of the plurality of rows of second organic encapsulating blocks 323b includes a plurality of second organic encapsulating blocks 323b spaced apart from each other.

When the first organic encapsulating layer 324 includes a plurality of rows of first organic encapsulating blocks 324b and the second organic encapsulating layer 323 includes a plurality of rows of second organic encapsulating blocks 323b, the bendable portion B may correspond to one or more rows of the plurality of rows of first organic encapsulating blocks 324b or one or more rows of the plurality of rows of second organic encapsulating blocks 323b. In one example, the bendable portion B corresponds to a single row of the plurality of rows of first organic encapsulating blocks 324b and a single row of the plurality of rows of second organic encapsulating blocks 323b. Optionally, the width of the single row of the plurality of rows of first organic encapsulating blocks 324b is greater than the width of the bendable portion B, which is in turn greater than the width of the single row of the plurality of rows of second organic encapsulating blocks 323b. In another example, the bendable portion B corresponds to multiple rows of the plurality of rows of first organic encapsulating blocks 324b or multiple rows of the plurality of rows of second organic encapsulating blocks 323b. For example, the width of the bendable portion B spans over multiple rows of the plurality of rows of first organic encapsulating blocks 324b or multiple rows of the plurality of rows of second organic encapsulating blocks 323b.

In some embodiments, the flexible display panel is a rollable display panel. In the rollable display panel, the first organic encapsulating layer 324 includes a plurality of rows of first organic encapsulating blocks 324b and the second organic encapsulating layer 323 includes a plurality of rows of second organic encapsulating blocks 323b, as exemplified in FIGS. 6 to 8. The rollable display panel includes a plurality of bendable portions, each of which corresponds to one row of the plurality of rows of first organic encapsulating blocks 324b and one row of the plurality of rows of second organic encapsulating blocks 323b. By having this structure, the rollable display panel has an enhanced flexibility, and at the same time an enhanced mechanical durability. For example, in the present rollable display panel the organic encapsulating layer is less prone to be separated from the inorganic encapsulating layers.

Referring to FIG. 3, the flexible display panel in some embodiments further includes a second inorganic encapsulating layer 330 on a side of the organic encapsulating layer 320 distal to the first inorganic encapsulating layer 310. e.g., on a side of the third organic encapsulating layer 322, the second organic encapsulating layer 323, and the first organic encapsulating layer 324 distal to the first inorganic encapsulating layer 310. Optionally, the third organic encapsulating layer 322 and the first organic encapsulating layer 324 are in contact with the second inorganic encapsulating layer 330. The second organic encapsulating layer 323 is spaced apart from the second inorganic encapsulating layer 330 by the first organic encapsulating layer 324.

Optionally, the flexible display panel is a flexible liquid crystal display panel. Optionally, the flexible display panel is a flexible organic light emitting diode display panel.

In another aspect, the present disclosure provides a method of fabricating a display panel, e.g., a flexible display panel. In some embodiments, the method includes forming a display unit on a base substrate (e.g., a flexible base substrate); and forming an encapsulating layer on a side of the display unit distal to the base substrate and encapsulating the display unit. Optionally, the step of forming the encapsulating layer includes forming a first inorganic encapsulating layer on a side of the display unit distal to the base substrate; and forming a first organic encapsulating layer and a second organic encapsulating layer on a side of the first inorganic encapsulating layer distal to the display unit. Optionally, each of the first organic encapsulating layer and the second organic encapsulating layer is formed to be in contact with the first inorganic encapsulating layer. Optionally, the first organic encapsulating layer has a Young's modulus lower than that of the second organic encapsulating layer.

In some embodiments, the display panel is formed to have a bendable portion in a position at which the display panel can be bent. Optionally, the first organic encapsulating layer is formed so that an orthographic projection of the first organic encapsulating layer on a plane containing a surface of the base substrate at least partially overlaps with an orthographic projection of the bendable portion on the plane containing the surface of the base substrate. Optionally, the first organic encapsulating layer is formed so that the orthographic projection of the first organic encapsulating layer on the plane containing the surface of the base substrate substantially covers the orthographic projection of the bendable portion on the plane containing the surface of the base substrate. Optionally, the first organic encapsulating layer is formed so that a width of the first organic encapsulating layer is approximately 1.2 times to approximately 2.0 times a width of the bendable portion.

Optionally, the second organic encapsulating layer and the first organic encapsulating layer are formed so that a width of second organic encapsulating layer is no more than approximately one third of a width of the first organic encapsulating layer. Optionally, the first organic encapsulating layer is formed on a side of the second organic encapsulating layer distal to the first inorganic encapsulating layer, and substantially covers the second organic encapsulating layer. Optionally, the second organic encapsulating layer and the first organic encapsulating layer are formed so that a thickness of second organic encapsulating layer is no more than approximately one half of a thickness of the first organic encapsulating layer.

In some embodiments, the display panel is formed to have a bendable portion in a position at which the display panel can be bent. Optionally, the second organic encapsulating layer is formed so that an orthographic projection of the second organic encapsulating layer on a plane containing a surface of the base substrate at least partially overlaps with an orthographic projection of the bendable portion on the plane containing the surface of the base substrate. Optionally, the second organic encapsulating layer is formed so that the orthographic projection of the bendable portion on the plane containing the surface of the base substrate substantially covers the orthographic projection of the second organic encapsulating layer on the plane containing a surface of the base substrate.

In some embodiments, the display panel is formed to have a bendable portion in a position at which the display panel can be bent. Optionally, the step of forming the second organic encapsulating layer includes forming a single second organic encapsulating block extending along a direction substantially parallel to a length direction of the bendable portion, and extending substantially through an entire length of the encapsulating layer. Optionally, the step of forming the second organic encapsulating layer includes forming a plurality of second organic encapsulating blocks spaced apart from each other and formed along a direction substantially parallel to a length direction of the bendable portion.

In some embodiments, the step of forming the encapsulating layer further includes forming a third organic encapsulating layer on a side of the first inorganic encapsulating layer distal to the display unit, and formed to be in contact with the first inorganic encapsulating layer. Optionally, the first organic encapsulating layer is formed on a side of the second organic encapsulating layer distal to the first inorganic encapsulating layer, and formed to substantially cover the second organic encapsulating layer. Optionally, the first organic encapsulating layer is formed to have a first side, a second side and a third side connecting the first side and the second side. A first portion of the third side is formed to be in contact with the first inorganic encapsulating layer. A second portion of the third side is formed to be in contact with the second organic encapsulating layer. Optionally, the third organic encapsulating layer is formed to sandwich the first organic encapsulating layer on the first side and the second side. Optionally, the first organic encapsulating layer has a Young's modulus lower than those of the second organic encapsulating layer and the third organic encapsulating layer.

Optionally, the third organic encapsulating layer is formed using a third organic material, and the second organic encapsulating layer is formed using a second organic material. Optionally, the third organic material and the second organic material have a substantially the same Young's modulus. Optionally, the third organic encapsulating layer and the second organic encapsulating layer are made of a same material. Optionally, the third organic material has a Young's modulus different from that of the second organic material. Optionally, the first organic encapsulating layer is formed using a material including a silicone resin. Optionally, the third organic encapsulating layer is formed using a material including one or a combination of a polyacrylate and an epoxy resin. Optionally, the second organic encapsulating layer is formed using a material including one or a combination of a polyacrylate and an epoxy resin.

Optionally, the third organic encapsulating layer and the second organic encapsulating layer are formed in a same layer using a same mask plate in a single patterning process. Optionally, the third organic encapsulating layer and the second organic encapsulating layer are formed in a same layer using a same material and using a same mask plate in a single patterning process.

In some embodiments, the display panel is formed to have a bendable portion in a position at which the display panel can be bent. Optionally, the step of forming the first organic encapsulating layer includes forming a plurality of rows of first organic encapsulating blocks, each of which extending substantially along a length direction of the bendable portion. Optionally, the step of forming the second organic encapsulating layer includes forming a plurality of rows of second organic encapsulating blocks, each of which extending along a direction substantially parallel to a length direction of the bendable portion. Optionally, each row of the plurality of rows of second organic encapsulating blocks is formed to include a single second organic encapsulating block extending substantially through an entire length of the encapsulating layer. Optionally, each row of the plurality of rows of second organic encapsulating blocks is formed to include a plurality of second organic encapsulating blocks spaced apart from each other.

In some embodiments, the method further includes forming a second inorganic encapsulating layer on a side of the first organic encapsulating layer and the second organic encapsulating layer distal to the first inorganic encapsulating layer. Optionally, the first organic encapsulating layer is formed to be in contact with the second inorganic encapsulating layer. Optionally, the second organic encapsulating layer is formed to be spaced apart from the second inorganic encapsulating layer by the first organic encapsulating layer. Optionally, the step of forming the encapsuldating layer further includes forming a third organic encapsulating layer between the first inorganic encapsulating layer and the second inorganic encapsulating layer. Optionally, the third organic encapsulating layer is formed to be in contact with the first inorganic encapsulating layer and the second inorganic encapsulating layer.

In another aspect, the present disclosure provides a display apparatus (e.g., a flexible display apparatus) having a display panel (e.g., a flexible display panel) described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
   a base substrate;
   a display unit on the base substrate; and
   an encapsulating layer on a side of the display unit distal to the base substrate and encapsulating the display unit;
   wherein the encapsulating layer comprises:
   a first inorganic encapsulating layer on a side of the display unit distal to the base substrate;
   a first organic encapsulating layer and a second organic encapsulating layer on a side of the first inorganic encapsulating layer distal to the display unit; and
   a third organic encapsulating layer on a side of the first inorganic encapsulating layer distal to the display unit, and in contact with the first inorganic encapsulating layer;
   wherein each of the first organic encapsulating layer and the second organic encapsulating layer is in contact with the first inorganic encapsulating layer; and
   the first organic encapsulating layer has a Young's modulus lower than that of the second organic encapsulating layer.

2. The display panel of claim 1, wherein the display panel has a bendable portion; and
   an orthographic projection of the first organic encapsulating layer on a plane containing a surface of the base substrate at least partially overlaps with an orthographic projection of the bendable portion on the plane containing the surface of the base substrate.

3. The display panel of claim 2, wherein the orthographic projection of the first organic encapsulating layer on the plane containing the surface of the base substrate substantially covers the orthographic projection of the bendable portion on the plane containing the surface of the base substrate.

4. The display panel of claim 3, wherein a width of the first organic encapsulating layer is approximately 1.2 times to approximately 2.0 times a width of the bendable portion.

5. The display panel of claim 1, wherein a width of the second organic encapsulating layer is no more than approximately one third of a width of the first organic encapsulating layer.

6. The display panel of claim 1, wherein the first organic encapsulating layer is on a side of the second organic encapsulating layer distal to the first inorganic encapsulating layer, and substantially covers the second organic encapsulating layer.

7. The display panel of claim 6, wherein a thickness of second organic encapsulating layer is no more than approximately one half of a thickness of the first organic encapsulating layer.

8. The display panel of claim 1, wherein the display panel has a bendable portion; and
   an orthographic projection of the second organic encapsulating layer on a plane containing a surface of the base substrate at least partially overlaps with an orthographic projection of the bendable portion on the plane containing the surface of the base substrate.

9. The display panel of claim 8, wherein the orthographic projection of the bendable portion on the plane containing the surface of the base substrate substantially covers the orthographic projection of the second organic encapsulating layer on the plane containing a surface of the base substrate.

10. The display panel of claim 1, wherein the display panel has a bendable portion; and
    the second organic encapsulating layer comprises a single second organic encapsulating block extending along a direction substantially parallel to a length direction of the bendable portion, and extending substantially through an entire length of the encapsulating layer.

11. The display panel of claim 1, wherein the display panel has a bendable portion; and
    the second organic encapsulating layer comprises a plurality of second organic encapsulating blocks spaced apart from each other and along a direction substantially parallel to a length direction of the bendable portion.

12. The display panel of claim 1, wherein the first organic encapsulating layer is on a side of the second organic encapsulating layer distal to the first inorganic encapsulating layer, and substantially covers the second organic encapsulating layer;
    the first organic encapsulating layer has a first side, a second side and a third side connecting the first side and the second side, a first portion of the third side in contact with the first inorganic encapsulating layer, a second portion of the third side in contact with the second organic encapsulating layer; and
    the third organic encapsulating layer sandwiches the first organic encapsulating layer on the first side and the second side.

13. The display panel of claim 1, wherein the third organic encapsulating layer comprises a third organic material;
    the second organic encapsulating layer comprises a second organic material; and
    the third organic material and the second organic material have a substantially the same Young's modulus.

14. The display panel of claim 1, wherein the third organic encapsulating layer comprises a third organic material;
    the second organic encapsulating layer comprises a second organic material; and
    the third organic material has a Young's modulus different from that of the second organic material.

15. The display panel of claim 1, wherein each of the third organic encapsulating layer and the second organic encapsulating layer comprises one or a combination of a polyacrylate and an epoxy resin.

16. The display panel of claim 1, wherein the first organic encapsulating layer comprises a silicone resin.

17. A display apparatus, comprising the display panel of claim 1.

18. A display panel, comprising:
a base substrate;
a display unit on the base substrate; and
an encapsulating layer on a side of the display unit distal to the base substrate and encapsulating the display unit;
wherein the encapsulating layer comprises:
a first inorganic encapsulating layer on a side of the display unit distal to the base substrate; and
a first organic encapsulating layer and a second organic encapsulating layer on a side of the first inorganic encapsulating layer distal to the display unit;
wherein each of the first organic encapsulating layer and the second organic encapsulating layer is in contact with the first inorganic encapsulating layer; and
the first organic encapsulating layer has a Young's modulus lower than that of the second organic encapsulating layer;
wherein the display panel has a bendable portion;
the first organic encapsulating layer comprises a plurality of rows of first organic encapsulating blocks, each of which extending substantially along a length direction of the bendable portion;
the second organic encapsulating layer comprises a plurality of rows of second organic encapsulating blocks, each of which extending along a direction substantially parallel to a length direction of the bendable portion; and
each row of the plurality of rows of second organic encapsulating blocks comprises a single second organic encapsulating block extending substantially through an entire length of the encapsulating layer.

19. A display panel, comprising:
a base substrate;
a display unit on the base substrate; and
an encapsulating layer on a side of the display unit distal to the base substrate and encapsulating the display unit;
wherein the encapsulating layer comprises:
a first inorganic encapsulating layer on a side of the display unit distal to the base substrate; and
a first organic encapsulating layer and a second organic encapsulating layer on a side of the first inorganic encapsulating layer distal to the display unit;
wherein each of the first organic encapsulating layer and the second organic encapsulating layer is in contact with the first inorganic encapsulating layer; and
the first organic encapsulating layer has a Young's modulus lower than that of the second organic encapsulating layer;
wherein the display panel has a bendable portion;
the first organic encapsulating layer comprises a plurality of rows of first organic encapsulating blocks, each of which extending along a direction substantially parallel to a length direction of the bendable portion;
the second organic encapsulating layer comprises a plurality of rows of second organic encapsulating blocks, each of which extending along a direction substantially parallel to a length direction of the bendable portion; and
each row of the plurality of rows of second organic encapsulating blocks comprises a plurality of second organic encapsulating blocks spaced apart from each other.

* * * * *